United States Patent
Tu

(10) Patent No.: US 11,049,922 B2
(45) Date of Patent: Jun. 29, 2021

(54) FLEXIBLE ARRAY SUBSTRATE AND DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Aiguo Tu, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 155 days.

(21) Appl. No.: 16/464,571

(22) PCT Filed: Sep. 6, 2018

(86) PCT No.: PCT/CN2018/104271
§ 371 (c)(1),
(2) Date: May 28, 2019

(87) PCT Pub. No.: WO2020/024360
PCT Pub. Date: Feb. 6, 2020

(65) Prior Publication Data
US 2020/0335567 A1    Oct. 22, 2020

(30) Foreign Application Priority Data
Aug. 3, 2018   (CN) .......................... 201810874657.9

(51) Int. Cl.
*H01L 27/32* (2006.01)
*H01L 51/00* (2006.01)
*G06F 1/16* (2006.01)

(52) U.S. Cl.
CPC ........ *H01L 27/3276* (2013.01); *G06F 1/1643* (2013.01); *G06F 1/1652* (2013.01); *H01L 51/0097* (2013.01)

(58) Field of Classification Search
CPC ............. H01L 27/3276; H01L 51/0097; H01L 2251/5338; G06F 1/1652; G06F 1/1643
See application file for complete search history.

(56) References Cited

U.S. PATENT DOCUMENTS

| 10,608,018 B2* | 3/2020 | Hanari | ................ H01L 27/3276 |
| 2014/0097408 A1* | 4/2014 | Kim | .................... H01L 27/3276 |
| | | | 257/40 |

(Continued)

FOREIGN PATENT DOCUMENTS

| CN | 103730476 A | | 4/2014 |
| CN | 106298798 A | * | 1/2017 |

(Continued)

*Primary Examiner* — Errol V Fernandes
*Assistant Examiner* — Jeremy J Joy

(57) ABSTRACT

A flexible array substrate and a display panel are provided. The flexible array substrate comprises a flexible substrate, a buffer layer, a plurality of signal lines, and pixel electrodes. The buffer layer is disposed on the flexible substrate. The plurality of signal lines is disposed on the buffer layer. A shape of the signal lines in a cross-sectional direction of the flexible array substrate is a curved shape with undulating portions or a polyline shape with undulating portions. In the disclosure, the signal line that has a curved shape with undulating portions or a polyline shape with undulating portions is disposed on the buffer layer, so that the signal line is able to cope with bending stress when bending.

7 Claims, 3 Drawing Sheets

(56) References Cited

U.S. PATENT DOCUMENTS

| | | | |
|---|---|---|---|
| 2014/0138637 A1* | 5/2014 | Yang | H01L 27/1218 257/40 |
| 2014/0232956 A1* | 8/2014 | Kwon | H01L 27/3276 349/12 |
| 2016/0064466 A1* | 3/2016 | Son | H01L 51/5253 257/40 |
| 2016/0087024 A1 | 3/2016 | Son et al. | |
| 2016/0285046 A1 | 9/2016 | Son et al. | |
| 2017/0373272 A1 | 12/2017 | Son et al. | |
| 2018/0212190 A1 | 7/2018 | Son et al. | |
| 2018/0219179 A1 | 8/2018 | Son et al. | |
| 2018/0219180 A1 | 8/2018 | Son et al. | |
| 2018/0219181 A1 | 8/2018 | Son et al. | |
| 2018/0331322 A1 | 11/2018 | Son et al. | |
| 2018/0342699 A1 | 11/2018 | Son et al. | |
| 2019/0041915 A1* | 2/2019 | Park | H01L 27/3262 |

FOREIGN PATENT DOCUMENTS

| | | |
|---|---|---|
| CN | 106298798 A | 1/2017 |
| CN | 106920800 A | 7/2017 |
| CN | 107978627 A | 5/2018 |

\* cited by examiner

FLEXIBLE ARRAY SUBSTRATE AND DISPLAY PANEL

FIELD OF INVENTION

This disclosure relates to display technology, and more particularly to a flexible array substrate and a display panel.

BACKGROUND OF INVENTION

With development of display technology, organic light-emitting diode (OLED) devises have characteristics of self-luminosity, no need of backlight, high contrast, thin thickness, wide viewing angles, fast response times, wide temperature tolerance range, having a simple process and structure for application in flexible panels. They are considered to be the next generation application technologies of flat panel displays.

Structure of the OLED device is composed of an anode (ITO), a cathode, and an organic functional layer sandwiched therebetween. The organic functional layer includes a layer composed of hole injection layer, hole transport layer, emissive layer, electron transport layer, and the like. In order to expand application range of the OLED device and to commercialize the OLED device, flexible technologies for increasing efficiency of the OLED device and lowering driving voltages have been developed.

At present, flexible display devices mainly include flexible OLED display devices, flexible electronic ink arrays, and flexible liquid crystal arrays. The OLED display devices have found widespread commercial applications. A display panel is a main component of the flexible display device. A conventional display panel mainly includes: a plurality of sub-pixels and a plurality of signal lines. The plurality of signal lines includes gate electrodes and data lines arranged in an interlaced arrangement and each of the sub-pixels is disposed in an area enclosed by the gate electrodes and the data lines interlaced with each other.

Generally, the display panel can be folded along a direction of a long side of the display panel and/or a direction of the short side of the display panel. However, if folding height of the display panel is great, the signal lines are subjected to a larger stress, and new signal lines are easily broken. That causes malfunction of the display panel.

SUMMARY OF INVENTION

The object of this disclosure is to provide a flexible array substrate and a display panel for solving drawbacks that folding amplitude of the display panel is larger, the stress on the signal lines is larger, and new signal lines are easily broken, thereby causing the display panel malfunction.

This disclosure provides a flexible array substrate, which comprises:
a flexible substrate;
a buffer layer disposed on the flexible substrate;
a plurality of signal lines disposed on the buffer layer, the plurality of the signal lines intersecting with each other to form a plurality of pixel regions; and
pixel electrodes disposed in the pixel regions and electrically connected to the signal lines;
wherein an outer contour shape of the buffer layer in a cross-sectional direction of the flexible array substrate is a curved shape with undulating portions or a polyline shape with undulating portions, so that the signal lines are in a shape of the curved shape or the polyline shape;
wherein the curved shape with the undulating portions is a wavy linear curved shape or a pulse-shaped curved shape, and wherein the buffer layer is constituted by a plurality of unit layers, a through hole or a groove is disposed on each of the unit layers to release a bending stress.

In a first embodiment of the flexible array substrate of the disclosure, the signal lines comprise data lines and gate lines, the data lines are arranged in columns, the gate lines are arranged in rows, and the buffer layer comprises first buffer units which are configured to dispose the data lines at intervals and second buffer units which are configured to dispose the gate lines at intervals; each of the data lines is correspondingly disposed on a plurality of the first buffer units, each of the gate lines is correspondingly disposed on a plurality of the second buffer units, and the first buffer units and the second buffer units are arranged in an interlaced manner.

In a first embodiment of the flexible array substrate of the disclosure, the flexible substrate comprises a bending zone for bending, a distance between two adjacent ones of the first buffer units in the same column located on the bending zone uniformly decreases from both sides of the bending zone to a central position of the bending zone, or a distance between two adjacent ones of the second buffer units in the same row located on the bending zone uniformly decreases from both sides of the bending zone to a central position of the bending zone, or both of the distance between the two adjacent ones of the first buffer units in the same column located on the bending zone and the distance between the two adjacent ones of the second buffer units of the same in the same row located on the bending zone are uniformly decreasing from the both sides of the bending zone to the central position of the bending zone.

In a first embodiment of the flexible array substrate of the disclosure, the signal lines comprise data lines and gate lines, the data lines are arranged in columns, the gate lines are arranged in rows, and the buffer layer comprises buffer units which are configured to dispose the data lines and the gate lines at intervals; and each of the buffer units is disposed below an intersection of one of the data lines and one of the gate lines.

In a first embodiment of the flexible array substrate of the disclosure, the flexible substrate comprises a bending zone for bending, a distance between two adjacent ones of the buffer units in the same column located on the bending zone uniformly decreases from both sides of the bending zone to a central position of the bending zone, or a distance between two adjacent ones of the buffer units in the same row located on the bending zone uniformly decreases from both sides of the bending zone to the central position of the bending zone, or both of the distance between two adjacent ones of the buffer units in the same column located on the bending zone and the distance between two adjacent ones of the buffer units of the same in the same row located on the bending zone are uniformly decreasing from the both sides of the bending zone to the central position of the bending zone.

This disclosure further provides a flexible array substrate, which comprises:
a flexible substrate;
a buffer layer disposed on the flexible substrate;
a plurality of signal lines disposed on the buffer layer, the plurality of the signal lines intersecting with each other to form a plurality of pixel regions; and
pixel electrodes disposed in the pixel regions and electrically connected to the signal lines;
wherein an outer contour shape of the buffer layer in a cross-sectional direction of the flexible array substrate is a curved shape with undulating portions or a polyline shape with undulating portions, so that the signal lines are in a shape of the curved shape or the polyline shape.

In the flexible array substrate of the disclosure, the curved shape with the undulating portions is a wavy linear curved shape or a pulse-shaped curved shape.

In the flexible array substrate of the disclosure, the buffer layer is constituted by a plurality of unit layers, and a through hole or a groove is disposed on each of the unit layers to release a bending stress.

In a second embodiment of the flexible array substrate of the disclosure, the signal lines comprise data lines and gate lines, the data lines are arranged in columns, the gate lines are arranged in rows, and the buffer layer comprises first buffer units which are configured to dispose the data lines at intervals and second buffer units which are configured to dispose the gate lines at intervals; each of the data lines is correspondingly disposed on a plurality of the first buffer units, each of the gate lines is correspondingly disposed on a plurality of the second buffer units, and the first buffer units and the second buffer units are arranged in an interlaced manner.

In a second embodiment of the flexible array substrate of the disclosure, the flexible substrate comprises a bending zone for bending, a distance between two adjacent ones of the first buffer units in the same column located on the bending zone uniformly decreases from both sides of the bending zone to a central position of the bending zone, or a distance between two adjacent ones of the second buffer units in the same row located on the bending zone uniformly decreases from both sides of the bending zone to a central position of the bending zone, or both of the distance between the two adjacent ones of the first buffer units in the same column located on the bending zone and the distance between the two adjacent ones of the second buffer units of the same in the same row located on the bending zone are uniformly decreasing from the both sides of the bending zone to the central position of the bending zone.

In a second embodiment of the flexible array substrate of the disclosure, the signal lines comprise data lines and gate lines, the data lines are arranged in columns, the gate lines are arranged in rows, and the buffer layer comprises buffer units which are configured to dispose the data lines and the gate lines at intervals; and each of the buffer units is disposed below an intersection of one of the data lines and one of the gate lines.

In a second embodiment of the flexible array substrate of the disclosure, the flexible substrate comprises a bending zone for bending, a distance between two adjacent ones of the buffer units in the same column located on the bending zone uniformly decreases from both sides of the bending zone to a central position of the bending zone, or a distance between two adjacent ones of the buffer units in the same row located on the bending zone uniformly decreases from both sides of the bending zone to the central position of the bending zone, or both of the distance between two adjacent ones of the buffer units in the same column located on the bending zone and the distance between two adjacent ones of the buffer units of the same in the same row located on the bending zone are uniformly decreasing from the both sides of the bending zone to the central position of the bending zone.

This disclosure further provides a display panel. The display panel comprises a comprising a flexible array substrate, an organic light emitting layer disposed on the flexible array substrate, and a cathode disposed on the organic light emitting layer.

the flexible array substrate, comprising:
a flexible substrate;
a buffer layer disposed on the flexible substrate;
a plurality of signal lines disposed on the buffer layer, the plurality of the signal lines intersecting with each other to form a plurality of pixel regions; and
pixel electrodes disposed in the pixel regions and electrically connected to the signal lines;
wherein an outer contour shape of the buffer layer in a cross-sectional direction of the flexible array substrate is a curved shape with undulating portions or a polyline shape with undulating portions, so that the signal line is in a shape of the curved shape or the polyline shape.

In the display panel of the disclosure, the curved shape with the undulating portions is a wavy linear curved shape or a pulse-shaped curved shape.

In the display panel of the disclosure, the buffer layer is constituted by a plurality of unit layers, and a through hole or a groove is disposed on each of the unit layers to release a bending stress.

In a first embodiment of the display panel of the disclosure, the signal lines comprise data lines and gate lines, the data lines are arranged in columns, the gate lines are arranged in rows, and the buffer layer comprises first buffer units which are configured to dispose the data lines at intervals and second buffer units which are configured to dispose the gate lines at intervals; each of the data lines is correspondingly disposed on a plurality of the first buffer units, each of the gate lines is correspondingly disposed on a plurality of the second buffer units, and the first buffer units and the second buffer units are arranged in an interlaced manner.

In a first embodiment of the display panel of the disclosure, the flexible substrate comprises a bending zone for bending, a distance between two adjacent ones of the first buffer units in the same column located on the bending zone uniformly decreases from both sides of the bending zone to a central position of the bending zone, or a distance between two adjacent ones of the second buffer units in the same row located on the bending zone uniformly decreases from both sides of the bending zone to a central position of the bending zone, or both of the distance between the two adjacent ones of the first buffer units in the same column located on the bending zone and the distance between the two adjacent ones of the second buffer units of the same in the same row located on the bending zone are uniformly decreasing from the both sides of the bending zone to the central position of the bending zone.

In a first embodiment of the display panel of the disclosure, the signal lines comprise data lines and gate lines, the data lines are arranged in columns, the gate lines are arranged in rows, and the buffer layer comprises buffer units which are configured to dispose the data lines and the gate lines at intervals; and each of the buffer units is disposed below an intersection of one of the data lines and one of the gate lines.

In a first embodiment of the display panel of the disclosure, the flexible substrate comprises a bending zone for bending, a distance between two adjacent ones of the buffer units in the same column located on the bending zone uniformly decreases from both sides of the bending zone to a central position of the bending zone, or a distance between two adjacent ones of the buffer units in the same row located on the bending zone uniformly decreases from both sides of the bending zone to the central position of the bending zone, or both of the distance between two adjacent ones of the buffer units in the same column located on the bending zone and the distance between two adjacent ones of the buffer units of the same in the same row located on the bending zone are uniformly decreasing from the both sides of the bending zone to the central position of the bending zone.

Compared with conventional display panels, the flexible array substrate and the display panel of the disclosure comprises the signal lines having a curved shape with undulating portions or a polyline shape with undulating portions disposed on the buffer layer, so that the signal lines have an ability for releasing a bending stress when bending. This disclosure can solve drawbacks of the conventional display panels that folding amplitude of the conventional display panel is larger, the stress on the signal lines is larger, and new signal lines are easily broken, thereby causing the display panel malfunction.

DESCRIPTION OF DRAWINGS

In order to more clearly illustrate the embodiments of the present invention or the technical solutions in the prior art, the following briefly introduces the accompanying drawings used in the embodiments. Obviously, the drawings in the following description merely show some of the embodiments of the present invention. As regards one of ordinary skill in the art, other drawings can be obtained in accordance with these accompanying drawings without making creative efforts.

DETAILED DESCRIPTION OF PREFERRED EMBODIMENTS

The specific details disclosed herein are merely representative and are intended to describe the purpose of the exemplary embodiments of this disclosure. This disclosure may be embodied in many and may not be construed as limited to the embodiments set forth herein.

Figure 1:
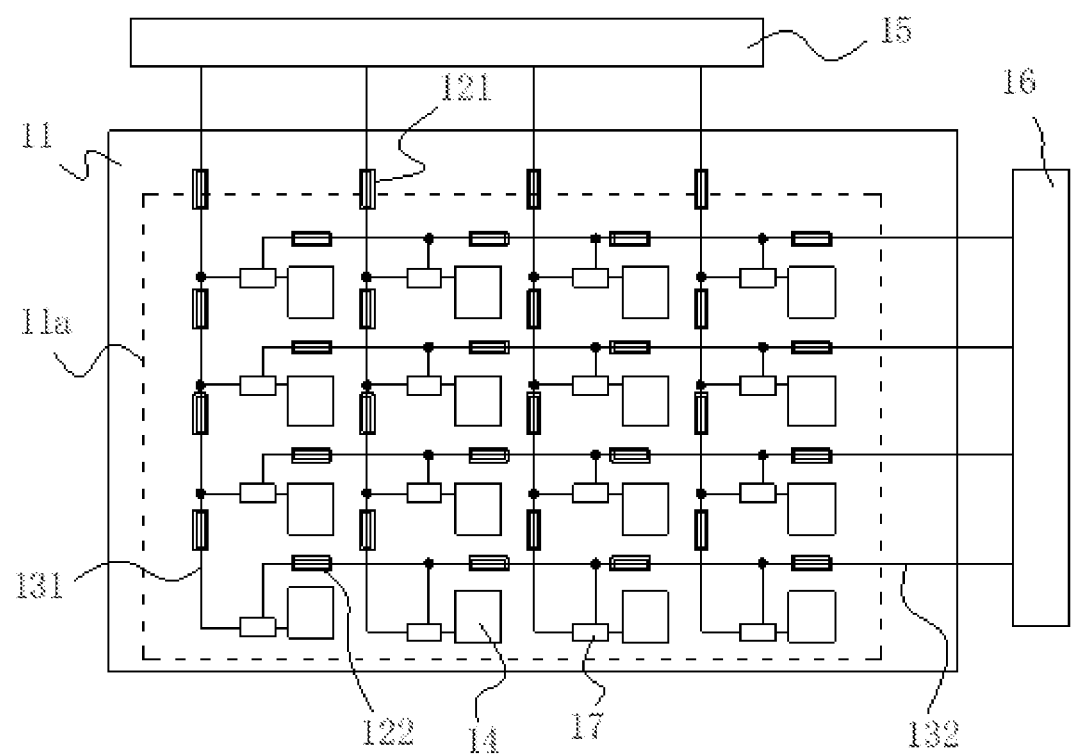
FIG. 1 is a structural schematic top view of a flexible array substrate according to a first embodiment of the disclosure.
Figure 2:
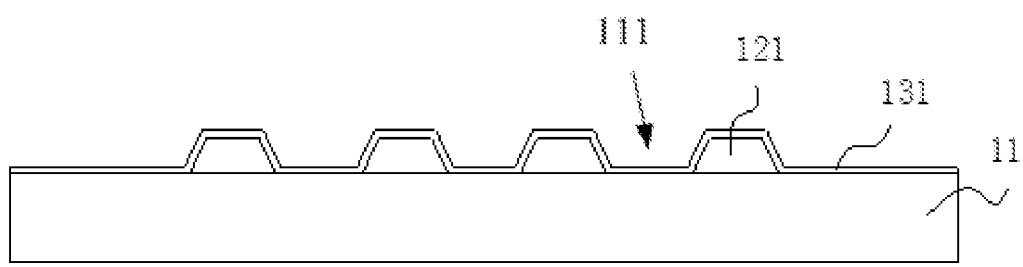
FIG. 2 is a cross-sectional structural schematic view of the flexible array substrate along a data line according to a first embodiment of the disclosure.
Figure 3:
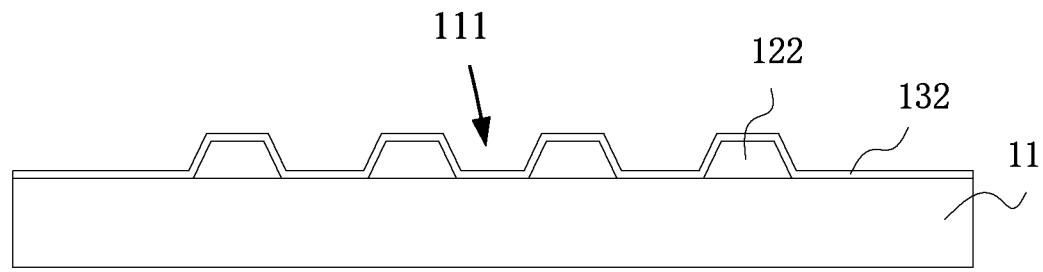
FIG. 3 is a cross-sectional structural schematic view of the flexible array substrate along a gate line according to a first embodiment of the disclosure.

Referring to FIGS. 1-3, a structural schematic top view of a flexible array substrate according to a first embodiment of the disclosure is shown, a cross-sectional structural schematic view of the flexible array substrate along a data line according to a first embodiment of the disclosure is shown, and a cross-sectional structural schematic view of the flexible array substrate along a gate line according to a first embodiment of the disclosure is shown.

The first embodiment of the disclosure provides a flexible array substrate. The flexible array substrate comprises a flexible substrate 11, a buffer layer, a plurality of signal lines, and pixel electrodes 14.

The buffer layer is disposed on the flexible substrate. The plurality of signal lines is disposed on the buffer layer. The plurality of the signal lines is intersecting with each other to form a plurality of pixel regions. The pixel electrodes are disposed in the pixel regions and are electrically connected to the signal lines. The pixel regions are arranged in an array manner.

Besides, an outer contour shape of the buffer layer in a cross-sectional direction of the flexible array substrate is a curved shape with undulating portions or a polyline shape with undulating portions, so that the signal lines are in a shape of the curved shape or the polyline shape.

The buffer layer is disposed on the flexible substrate 11 disclosed in the first embodiment of the disclosure. Moreover, the signal lines are disposed on the buffer layer. Since the buffer layer is arranged in an array manner, the signal lines disposed on the buffer layer comprise a curved shape with undulating portions or a polyline shape with undulating portions. Therefore, when the signal line is subjected to a bending stress, the signal line has the ability to resist bending, so that the signal line is protected from being damaged.

In addition, the specific formation of the signal lines in the cross-sectional direction of the array substrate depends on the specific shape of the buffer layer. For example, when a cross section of the first buffer unit 121 and the second buffer unit 122 of the buffer layer is crest-shaped, the curved shape having the undulating portions is a wavy linear curved shape or a pulse-shaped curved shape. In the first embodiment, the cross section of the first buffer unit 121 and the second buffer unit 122 is an isopope trapezoid shape, and the data lines 131 and the gate lines 132 are both polyline shape.

In the first embodiment of the flexible array substrate of the disclosure, the signal lines comprise data lines 131 and gate lines 132, the data lines 131 are arranged in columns, the gate lines 132 are arranged in rows. The buffer layer comprises first buffer units 121 which are configured to dispose the data lines 131 at intervals, and second buffer units 122 which are configured to dispose the gate lines 132 at intervals.

Each of the data lines 131 is correspondingly disposed on a plurality of the first buffer units 121. Each of the gate lines 132 is correspondingly disposed on a plurality of the second buffer units 122. The first buffer units 121 and the second buffer units 122 are arranged in an interlaced manner.

Since the first buffer unit 121 and the second buffer unit 122 correspond to the data line 131 and the gate line 132, respectively, traces of the data line 131 and the gate line 132 are different, such an arrangement improves a stability of the data line 131 and the gate line 132 supported by the buffer layer, respectively. That is, an extending direction of the first buffer unit 121 coincides with an extending direction of the data line 131, and an extending direction of the second buffer unit 122 coincides with an extending direction of the gate line 132.

Moreover, the flexible substrate 11 comprises a bending zone 11a for bending, both of a distance between the two adjacent ones of the first buffer units 121 in the same column located on the bending zone 11a and a distance between the two adjacent ones of the second buffer units 122 of the same in the same row located on the bending zone 11a are uniformly decreasing from the both sides of the bending zone to the central position of the bending zone.

A configuration as the above mentioned improves the ability of the data line 131 and the gate line 132 against the bending stress.

It can be understood that when the array substrate is bent, a region in a central area of the bending region 11a receives the maximum bending stress and the bending stress gradually decreases toward both sides of the array substrate. Therefore, when the distance between the two adjacent ones of the first buffer units 121 and the distance between the two adjacent ones of the second buffer units 122 in the same row are uniformly decreased from the both sides of the bending zone toward the center position, a density of the first buffer unit 121 and the second buffer unit 122 is increased, and a undulation density of the data line 131 and the gate line 132 is further increased. The bending stress is reduced to protect the signal lines.

Additionally, since the distance between the two adjacent ones of the first buffer units 121 and the distance between the two adjacent ones of the second buffer units 122 in the same row are uniformly decreased from the both sides of the bending zone toward the center position of the bending zone, the array substrate can be bent in a longitudinal direction and a lateral direction.

Of course, in the disclosure, in the bending zone, only a distance between two adjacent ones of the first buffer units in the same column located on the bending zone uniformly decreases from both sides of the bending zone to a central position of the bending zone, so that the bending of the array substrate in the lateral direction can be realized. A distance between two adjacent ones of the second buffer units in the same row located on the bending zone uniformly decreases from both sides of the bending zone to a central position of the bending zone, Alternatively, in the bending zone, only a distance between two adjacent ones of the second buffer units in the same row located on the bending zone uniformly decreases from both sides of the bending zone to a central position of the bending zone, so that the bending of the array substrate in the longitudinal direction can be realized.

Furthermore, the buffer layer disposed in the bending zone 11a is composed of a plurality of unit layers, each of which comprises a through hole or a groove. The through holes or grooves between the adjacent unit layers are arranged in an interlaced manner. In such configuration, when the buffer layer is subjected to the bending stress, the through hole or the groove located in a periphery area of the bending zone is enlarged by a tensile force, and the through hole or the groove located in an inner area of the bending zone is downsized by a pressing force, thereby reducing the bending stress and protecting the signal lines disposed on the buffer layer.

In the first embodiment, four of the data lines 131 and four of the gate lines 132 are taken as an example, but are not limited thereto. Four of the data lines 131 are connected to a source driving circuit 15, four of the gate lines 132 are connected to a gate driving circuit 16, and the pixel electrodes 14 are connected to the data lines 131 and the gate lines 132 through thin film transistors 17.

Figure 4:
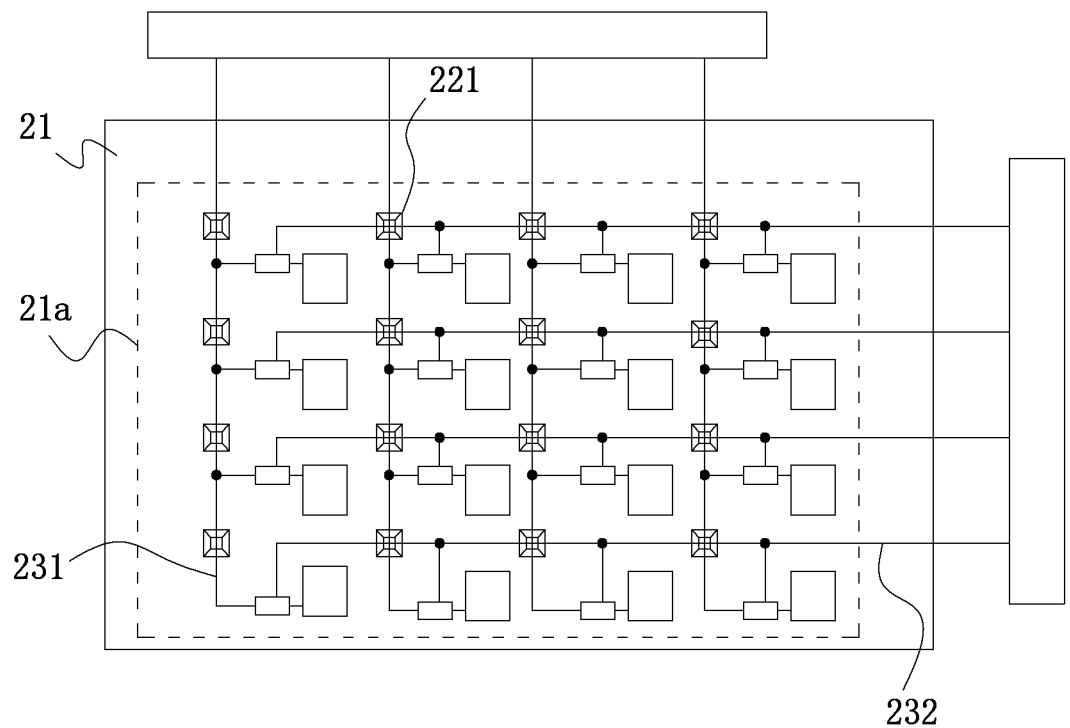
FIG. 4 is a structural schematic top view of a flexible array substrate according to a second embodiment of the disclosure.

Referring to FIG. 4, in a second embodiment of the flexible array substrate of the disclosure, the difference between this embodiment and the first embodiment is that the signal lines comprise data lines 231 and gate lines 232. The data lines 231 are arranged in columns, the gate lines 232 are arranged in rows. The buffer layer comprises buffer units 221 which are configured to dispose the data lines 231 and the gate lines 232, and the buffer units 221 are interval disposed. Each of the buffer units 221 is disposed below an intersection of one of the data lines 231 and one of the gate lines 232.

An arrangement of the buffer unit 221 is simplified by disposing one data line 231 and one gate line 232 simultaneously on one buffer unit 221, and thereby saving material cost. In addition, when the remaining one of the data lines 231 does not intersect the gate line 232, the buffer unit 221 and the other buffer units 221 disposed under the data line 231 are arranged in an array.

The flexible substrate 21 comprises a bending zone 12a for bending, both of a distance between two adjacent ones of the buffer units 221 in the same column located on the bending zone and a distance between two adjacent ones of the buffer units 221 of the same in the same row located on the bending zone are uniformly decreasing from the both sides of the bending zone to the central position of the bending zone, thereby a lateral bending of the array substrate and a longitudinal bending of the array substrate can be achieved.

In addition, a length of the data line 231 overlapped on the buffer unit 221 is the same with a length of the gate line 232 overlapped on the buffer unit 221. When the array substrate is preformed the lateral bending and the longitudinal bending dynamically, a stress equalization of the data line 231 and the gate line 232 is ensured, and a security of the data line 231 and the gate line 232 is improved.

Additionally, when a distance between two adjacent ones of the buffer units 221 in the same column located on the bending zone 21a uniformly decreases from the two sides toward the center position, the lateral bending of the array substrate can be realized, and the length of the data line 231 overlapping on the buffer unit 221 is larger than the length of the gate line 232 overlapping on the buffer unit 221. When the distance between two adjacent ones of the buffer units 221 in the same row located on the bending zone 21a uniformly decreases from both sides of the bending zone toward the center position of the bending zone, the length of the data line 231 overlapping on the buffer unit 221 is less than the length of the gate line 232 overlapping on the buffer unit 221, the longitudinal bending of the array substrate can realized.

Figure 5:
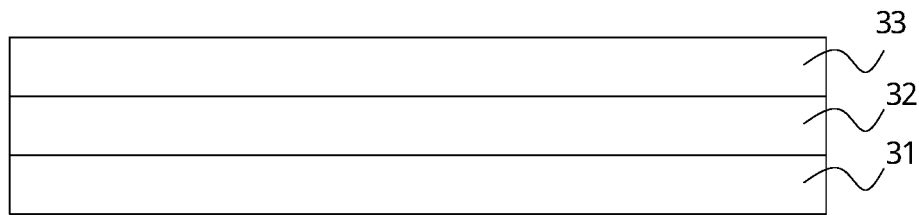
FIG. 5 is a structural schematic view of a display panel according to a first embodiment of the disclosure.

Referring to FIG. 5, this disclosure further provides a display panel. The display panel comprises a comprising a flexible array substrate 31, an organic light emitting layer 32 disposed on the flexible array substrate 31, and a cathode 33 disposed on the organic light emitting layer 32.

The flexible array substrate comprises a flexible substrate, a buffer layer disposed on the flexible substrate, a plurality of signal lines disposed on the buffer layer, the plurality of the signal lines intersecting with each other to form a plurality of pixel regions, and pixel electrodes disposed in the pixel regions and electrically connected to the signal lines.

An outer contour shape of the buffer layer in a cross-sectional direction of the flexible array substrate is a curved shape with undulating portions or a polyline shape with undulating portions, so that the signal line is in a shape of the curved shape or the polyline shape.

In the display panel of the disclosure, the curved shape with the undulating portions is a wavy linear curved shape or a pulse-shaped curved shape.

In a first embodiment of the display panel of the disclosure, the signal lines comprise data lines and gate lines, the data lines are arranged in columns, the gate lines are arranged in rows, and the buffer layer comprises first buffer units which are configured to dispose the data lines at intervals and second buffer units which are configured to dispose the gate lines at intervals. Each of the data lines is correspondingly disposed on a plurality of the first buffer units, each of the gate lines is correspondingly disposed on a plurality of the second buffer units, and the first buffer units and the second buffer units are arranged in an interlaced manner.

In a first embodiment of the display panel of the disclosure, the flexible substrate comprises a bending zone for bending, a distance between two adjacent ones of the first buffer units in the same column located on the bending zone uniformly decreases from both sides of the bending zone to a central position of the bending zone, or a distance between two adjacent ones of the second buffer units in the same row located on the bending zone uniformly decreases from both sides of the bending zone to a central position of the bending zone, or both of the distance between the two adjacent ones of the first buffer units in the same column located on the bending zone and the distance between the two adjacent ones of the second buffer units of the same in the same row located on the bending zone are uniformly decreasing from the both sides of the bending zone to the central position of the bending zone.

Furthermore, the buffer layer disposed in the bending zone is composed of a plurality of unit layers, each of which comprises a through hole or a groove. The through holes or grooves between the adjacent unit layers are arranged in an interlaced manner. In such configuration, when the buffer layer is subjected to the bending stress, the through hole or the groove located in a periphery area of the bending zone is enlarged by a tensile force, and the through hole or the groove located in an inner area of the bending zone is downsized by a pressing force, thereby reducing the bending stress and protecting the signal lines disposed on the buffer layer.

In a second embodiment of the display panel of the disclosure, the difference between this embodiment and the first embodiment is of the display panel that the signal lines comprise data lines and gate lines. The data lines are arranged in columns, the gate lines are arranged in rows. The buffer layer comprises buffer units which are configured to dispose the data lines and the gate lines, and the buffer units 221 are interval disposed. Each of the buffer units is disposed below an intersection of one of the data lines and one of the gate lines.

Each of the buffer units is disposed below an intersection of one of the data lines and one of the gate lines.

In the second embodiment of the display panel of the disclosure, the flexible substrate comprises a bending zone for bending, a distance between two adjacent ones of the buffer units in the same column located on the bending zone uniformly decreases from both sides of the bending zone to a central position of the bending zone, or a distance between two adjacent ones of the buffer units in the same row located on the bending zone uniformly decreases from both sides to the central position, or both of the distance between two adjacent ones of the buffer units in the same column located on the bending zone and the distance between two adjacent ones of the buffer units of the same in the same row located on the bending zone are uniformly decreasing from the both sides of the bending zone to the central position of the bending zone.

Compared with conventional display panels, the flexible array substrate and the display panel of the disclosure comprises the signal lines having a curved shape with undulating portions or a polyline shape with undulating portions disposed on the buffer layer, so that the signal lines have an ability for releasing a bending stress when bending. This disclosure can solve drawbacks of the conventional display panels that folding amplitude of the conventional display panel is larger, the stress on the signal lines is larger, and new signal lines are easily broken, thereby causing the display panel malfunction.

Despite being relative to one or more implementations shown and described the disclosure, equivalent variations and modifications will occur to those skilled in the art based on the present specification and drawings upon reading the disclosure. The present disclosure includes all such modifications and variations, and is only limited by the scope of the appended claims. Additionally, although a particular feature of the present disclosure has been made with respect to certain implementations, only one is disclosed, but this feature may be as given or particular application and the purpose of enabling a desired one or more other implementations Other combinations of features. Moreover, the terms "comprising,", "having,", "containing," or variants thereof are used in the detailed description or the claims, such terms are intended to be used in a manner similar to the term "comprising"

Although the disclosure has been disclosed in the above embodiments, and serial numbers before the embodiments, such as "first", "second", etc., are used for convenience of description only, and the order of the embodiments of the disclosure is not limited. This disclosure has been described with preferred embodiments thereof, and it is understood that many changes and modifications to the described embodiment can be carried out without departing from the scope and the spirit of the invention that is intended to be limited only by the appended claims.

The invention claimed is:

1. A flexible array substrate, comprising:
 a flexible substrate;
 a buffer layer disposed on the flexible substrate;
 a plurality of signal lines disposed on the buffer layer, the plurality of the signal lines intersecting with each other to form a plurality of pixel regions, wherein the signal lines comprise data lines and gate lines, the data lines are arranged in columns, the gate lines are arranged in rows, and the buffer layer comprises first buffer units configured to dispose the data lines at intervals and second buffer units which are configured to dispose the gate lines at intervals, and wherein each of the data lines is correspondingly disposed on a plurality of the first buffer units, each of the gate lines is correspondingly disposed on a plurality of the second buffer units, and the first buffer units and the second buffer units are arranged in an interlaced manner; and
 pixel electrodes disposed in the pixel regions and electrically connected to the signal lines;
 wherein an outer contour shape of the buffer layer in a cross-sectional direction of the flexible array substrate is a curved shape with undulating portions or a polyline shape with undulating portions, so that the signal lines are in a shape of the curved shape or the polyline shape;
 wherein the curved shape with the undulating portions is a wavy linear curved shape or a pulse-shaped curved shape, and wherein the buffer layer is constituted by a plurality of unit layers, a through hole or a groove is disposed on each of the unit layers to release a bending stress;
 wherein the flexible substrate comprises a bending zone for bending, a distance between two adjacent ones of the first buffer units in the same column located on the bending zone uniformly decreases from both sides of the bending zone to a central position of the bending zone, or a distance between two adjacent ones of the second buffer units in the same row located on the bending zone uniformly decreases from both sides of the bending zone to a central position of the bending zone, or both of the distance between the two adjacent ones of the first buffer units in the same column located on the bending zone and the distance between the two adjacent ones of the second buffer units in the same row located on the bending zone uniformly decreases from both sides of the bending zone to the central position of the bending zone.

2. A flexible array substrate, comprising:

a flexible substrate;

a buffer layer disposed on the flexible substrate;

a plurality of signal lines disposed on the buffer layer, the plurality of the signal lines intersecting with each other to form a plurality of pixel regions, wherein the signal lines comprise data lines and gate lines, the data lines are arranged in columns, the gate lines are arranged in rows, and the buffer layer comprises buffer units which are configured to dispose the data lines and the gate lines at intervals, and wherein each of the buffer units is disposed below an intersection of one of the data lines and one of the gate lines; and pixel electrodes disposed in the pixel regions and electrically connected to the signal lines;

wherein an outer contour shape of the buffer layer in a cross-sectional direction of the flexible array substrate is a curved shape with undulating portions or a polyline shape with undulating portions, so that the signal lines are in a shape of the curved shape or the polyline shape;

wherein the flexible substrate comprises a bending zone for bending, a distance between two adjacent ones of the buffer units in the same column located on the bending zone uniformly decreases from both sides of the bending zone to a central position of the bending zone, or a distance between two adjacent ones of the buffer units in the same row located on the bending zone uniformly decreases from both sides of the bending zone to the central position of the bending zone, or both of the distance between two adjacent ones of the buffer units in the same column located on the bending zone and the distance between two adjacent ones of the buffer units in the same row located on the bending zone are uniformly decreasing from both sides of the bending zone to the central position of the bending zone.

3. The flexible array substrate according to claim 2, wherein the curved shape with the undulating portions is a wavy linear curved shape or a pulse-shaped curved shape.

4. The flexible array substrate according to claim 1, wherein the buffer layer is constituted by a plurality of unit layers, and a through hole or a groove is disposed on each of the unit layers to release a bending stress.

5. A display panel, comprising a flexible array substrate, an organic light emitting layer disposed on the flexible array substrate, and a cathode disposed on the organic light emitting layer;

the flexible array substrate, comprising:

a flexible substrate;

a buffer layer disposed on the flexible substrate;

a plurality of signal lines disposed on the buffer layer, the plurality of the signal lines intersecting with each other to form a plurality of pixel regions, wherein the signal lines comprise data lines and gate lines, the data lines are arranged in columns, the gate lines are arranged in rows, and the buffer layer comprises buffer units which are configured to dispose the data lines and the gate lines at intervals, and wherein each of the buffer units is disposed below an intersection of one of the data lines and one of the gate lines; and pixel electrodes disposed in the pixel regions and electrically connected to the signal lines;

wherein an outer contour shape of the buffer layer in a cross-sectional direction of the flexible array substrate is a curved shape with undulating portions or a polyline shape with undulating portions, so that the signal line is in a shape of the curved shape or the polyline shape;

wherein the flexible substrate comprises a bending zone for bending, a distance between two adjacent ones of the buffer units in the same column located on the bending zone uniformly decreases from both sides of the bending zone to a central position of the bending zone, or a distance between two adjacent ones of the buffer units in the same row located on the bending zone uniformly decreases from both sides of the bending zone to the central position of the bending zone, or both of the distance between two adjacent ones of the buffer units in the same column located on the bending zone and the distance between two adjacent ones of the buffer units in the same row located on the bending zone are uniformly decreasing from both sides of the bending zone to the central position of the bending zone.

6. The display panel according to claim 5, wherein the curved shape with the undulating portions is a wavy linear curved shape or a pulse-shaped curved shape.

7. The display panel according to claim 5, wherein the buffer layer is constituted by a plurality of unit layers, and a through hole or a groove is disposed on each of the unit layers to release a bending stress.

* * * * *